| (12) | United States Patent | (10) Patent No.: | US 11,605,623 B2 |
|---|---|---|---|
| | Singh et al. | (45) Date of Patent: | Mar. 14, 2023 |

(54) MATERIALS AND LAYOUT DESIGN OPTIONS FOR DSA ON TRANSITION REGIONS OVER ACTIVE DIE

(71) Applicant: Intel Corporation, Santa Clara, CA (US)

(72) Inventors: Gurpreet Singh, Portland, OR (US); Eungnak Han, Portland, OR (US); Paul A. Nyhus, Portland, OR (US); Florian Gstrein, Portland, OR (US); Richard E. Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 744 days.

(21) Appl. No.: 16/457,699

(22) Filed: Jun. 28, 2019

(65) Prior Publication Data

US 2020/0411501 A1 Dec. 31, 2020

(51) Int. Cl.
*H01L 27/02* (2006.01)
*C08L 33/12* (2006.01)
*C08L 25/06* (2006.01)
*C08L 53/00* (2006.01)

(52) U.S. Cl.
CPC .......... *H01L 27/0207* (2013.01); *C08L 25/06* (2013.01); *C08L 33/12* (2013.01); *C08L 53/00* (2013.01)

(58) Field of Classification Search
CPC .......... C08L 53/00; C08L 25/06; C08L 33/12; H01L 27/0207
See application file for complete search history.

(56) References Cited

U.S. PATENT DOCUMENTS

| 8,906,799 B1 | 12/2014 | Filippi | |
| 10,641,959 B1 * | 5/2020 | Park | G02B 6/1228 |
| 2012/0127454 A1 | 5/2012 | Nakamura | |
| 2019/0301906 A1 * | 10/2019 | Udrea | H01L 35/34 |

FOREIGN PATENT DOCUMENTS

WO  WO 2015/047320  4/2015

OTHER PUBLICATIONS

Search Report from European Patent Application No. 20162942.5, dated Sep. 2, 2020, 8pgs.

* cited by examiner

*Primary Examiner* — Dale E Page
*Assistant Examiner* — Wilner Jean Baptiste
(74) *Attorney, Agent, or Firm* — Schwabe, Williamson & Wyatt, P.C.

(57) ABSTRACT

An integrated circuit structure includes an active region containing more active semiconductor devices, wherein the active region comprises a first grating of metal and dielectric materials with only vertically aligned structures thereon. A transition region containing inactive structures is adjacent to the active region, wherein the transition region comprises a second grating of metal and dielectric materials having at least one of vertical aligned structures and vertical random structures thereon. Both the active regions and the transition regions have an absence of non-uniform gratings with horizontal parallel polymer sheets thereon.

13 Claims, 13 Drawing Sheets

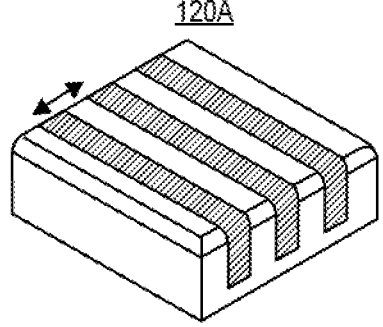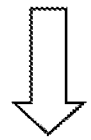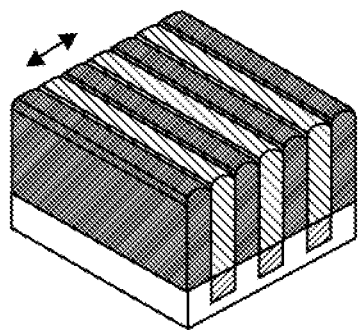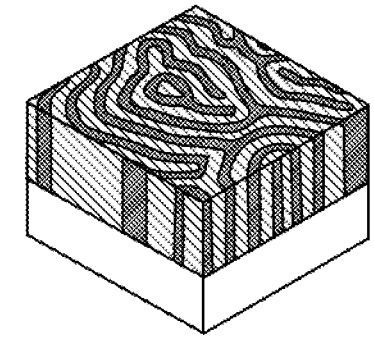
FIG. 4A  FIG. 4B

MATERIALS AND LAYOUT DESIGN OPTIONS FOR DSA ON TRANSITION REGIONS OVER ACTIVE DIE

TECHNICAL FIELD

Embodiments of the disclosure are in the field of integrated circuit structures and, in particular, materials and layout design options for direct self-assembly (DSA) on transition regions over active die.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. The drive for ever-more functionality, however, is not without issue. It has become increasingly significant to rely heavily on innovative fabrication techniques to meet the exceedingly tight tolerance requirements imposed by scaling.

For example, such scaling has led to a rise in use of directed self-assembly (DSA) semiconductor patterning instead of lithography. DSA patterning enables fine pitches using block copolymers. In DSA, a lithography system forms a pre-defined pattern on a structure, and the pattern is coated with block copolymers, which then self-assemble on the pattern to form the small patterns, such as lines and spaces. One example use of DSA is the formation of transition regions on a semiconductor die that are used to separate active regions containing semiconductor devices. The current layout design of the transition regions when fabricated using DSA typically leads to formation of undesirable horizontal morphology as a result of parallel orientation of BCP microdomain), rather than vertical microdomain orientation. Of major concern is that horizontal morphology (polymer sheets of alternating blocks) lead to left behind polymer on the die/wafer that lead to downstream reliability and defect concerns.

BRIEF DESCRIPTION OF THE DRAWINGS

FIGS. 4A-4C illustrate possible BCP orientations that may result from the DSA process.

DESCRIPTION OF THE EMBODIMENTS

Figure 1:
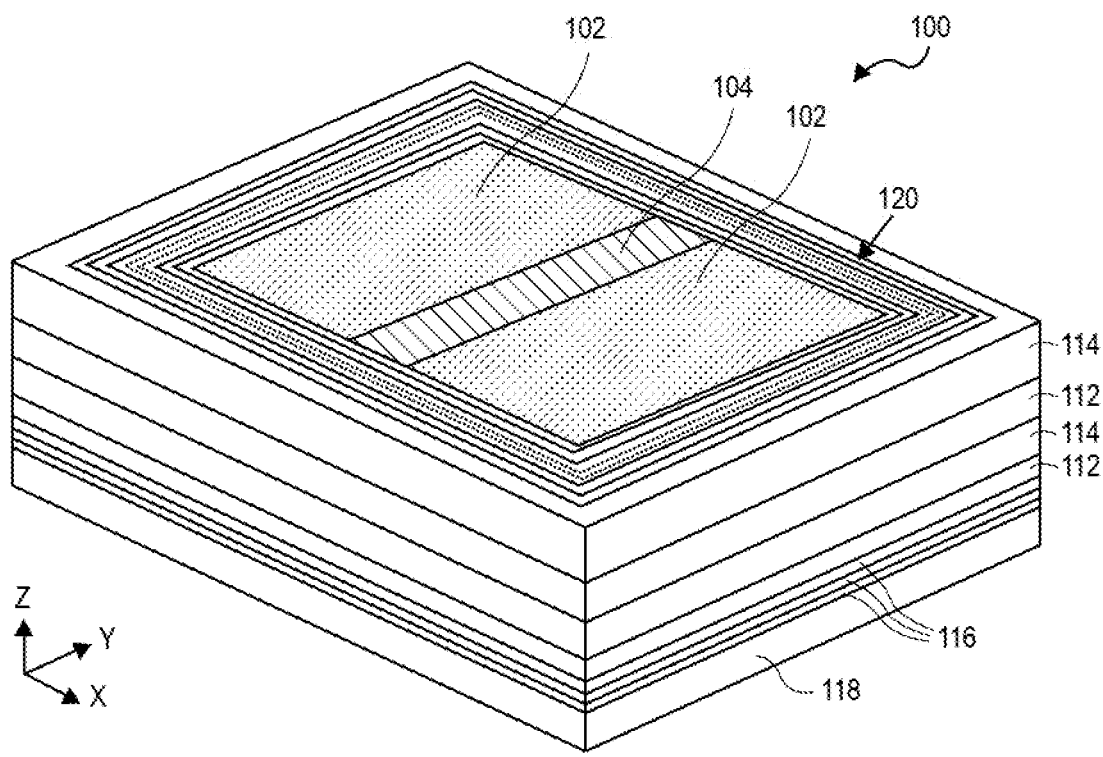
FIG. 1 illustrates a perspective view illustrates a die having active regions separated by a transition region.

Materials and layout design options for direct self-assembly (DSA) on transition regions over active die are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Some semiconductor processing uses photoresist to define conductive traces in the electrically active regions. In such a method, photoresist is applied to the substrate, patterned, and then developed to remove the non-polymerized resist and leave behind a mask pattern for the desired structure. A limitation of some photo-resist methods is that the tightest pitch is generally about 80 nm or greater for lithography utilizing an argon-fluoride (ArF) laser, and about 45 nm for extreme ultraviolet (EUV) lithography. This pitch is disfavored in some situations because it consumes large areas on the die or integrated circuit. One possible approach is to use a directed self-alignment (DSA) copolymer solution to achieve even tighter pitches for conductive traces or interconnects and other structures.

In accordance with one or more embodiments of the present invention, fabrication processes are described for materials and layout design options for direct self-assembly (DSA) on transition regions over active die to eliminate DSA sheets in the transition regions. One or more embodiments described herein are directed to integrated circuit structures formed with DSA approaches in which active regions and transition regions are formed on a die. The active regions comprise uniform gratings of metal and dielectric materials that are DSA compatible and consist of vertically aligned structures, while the transition regions comprise at least one of uniform gratings having vertical aligned structures, and non-uniform gratings having vertical random structures (referred to as fingerprints). Both the active regions and the transition regions have an absence of non-uniform gratings with horizontal parallel polymer sheets thereon, which are known to cause defects. In an embodiment, the uniform gratings are provided by analyzing layout designs for the active regions and the transition regions to identify areas having non-uniform gratings that are not compatible with DSA. The layout designs for the non-uniform gratings are made uniform, and thus DSA compatible, by insertion of dummy structures in the layout designs to convert the non-uniform gratings to DSA compatible uniform gratings in order to form the vertical aligned or vertical random structures, but not horizontal DSA sheets during fabrication. In accordance with one or more embodiments of the present disclosure, such an architecture of the fabrication process enables DSA to solve critical interconnect formation problems in future technology nodes.

To provide context, FIG. 1 illustrates a perspective view of a die 100 having active regions 102 separated by a transition region 104. The active regions 102 and the transition region 104 may be formed in semiconductor material layers 116 and/or base 118. Each active region 102 may include conductive structures that extend from a metallization layer 114 to one or more of the semiconductor material layers 116. The active region 102 may contain one or more active semiconductor devices (e.g., transistors, diodes), passive devices (e.g., resistors, capacitors, inductors), and interconnects assembled to form an integrated circuit. The active region 102 can include devices and interconnects that are diffused, implanted, deposited, or otherwise formed in layers of semiconductor materials on the base 118. In contrast, the transition region 104 contains only inactive structures (e.g., traces). The die 100 may optionally include a guard ring structure 120. Via 30 layers 112 and metallization layers 114 are formed on top of the semiconductor material layers 116 and generally include a dielectric material. The base 118 can comprise, for example, a bulk semiconductor wafer (e.g., silicon) or a substrate material (e.g., sapphire).

Figure 2:
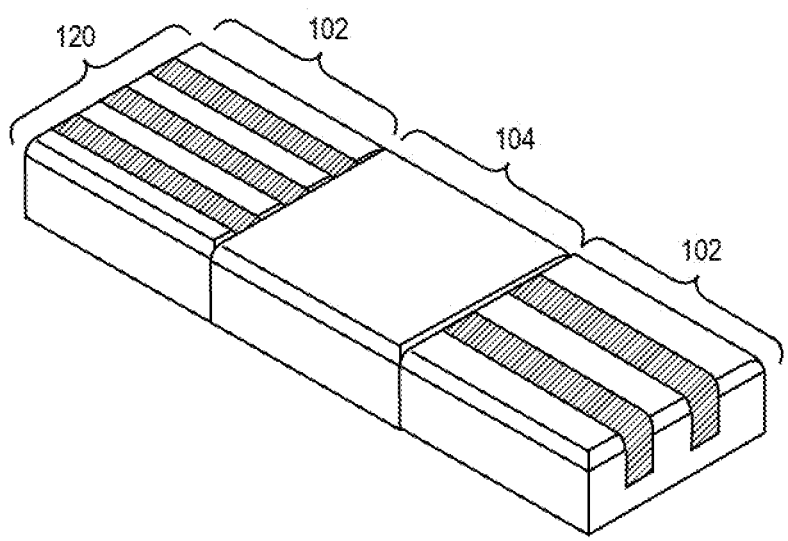
FIG. 2 illustrates that the active regions and the transition regions are defined by a layout design specifying respective gratings of alternating conductive layers (e.g., metal) and insulating layers (e.g, an interlayer dielectric (ILD)), referred to as metal gratings.

FIG. 2 illustrates that the active regions 102 and the transition regions 104 are defined by a layout design specifying respective gratings of alternating conductive layers (e.g., metal) and insulating layers (e.g., an interlayer dielectric (ILD)), hereinafter referred to as metal gratings 120. In this example, the active regions 102 have different grating pitches, which would break the metal gratings 120 if the active regions 102 were placed side-by-side, necessitating use of transition region 104 to separate the active regions 102.

According to the disclosed embodiments, structures or features are fabricated on the active regions 102 and the transition regions 104 by utilizing a direct self-assembly (DSA) processing sequence. DSA utilizes principles of chemoepitaxy and graphoepitaxy to depose a block copolymer (BCP) comprising first and second polymer components onto an incoming metal gratings 120. In one embodiment, the polymer components may comprise A-B type BCP materials, or A-B-A or A-B-C type BCP materials. In one example embodiment, the polymer components may comprise a polystyrene (PS) component and a polymethylmethacrylate (PMMA) component. For a description of A-B-A type BCP materials, refer to WO2018125089 (PCT/US2016/068931) titled "GRATING LAYER WITH VARIABLE PITCH FORMED USING DIRECTED SELF-ASSEMBLY OF MULTIBLOCK COPOLYMERS."

Figure 3:
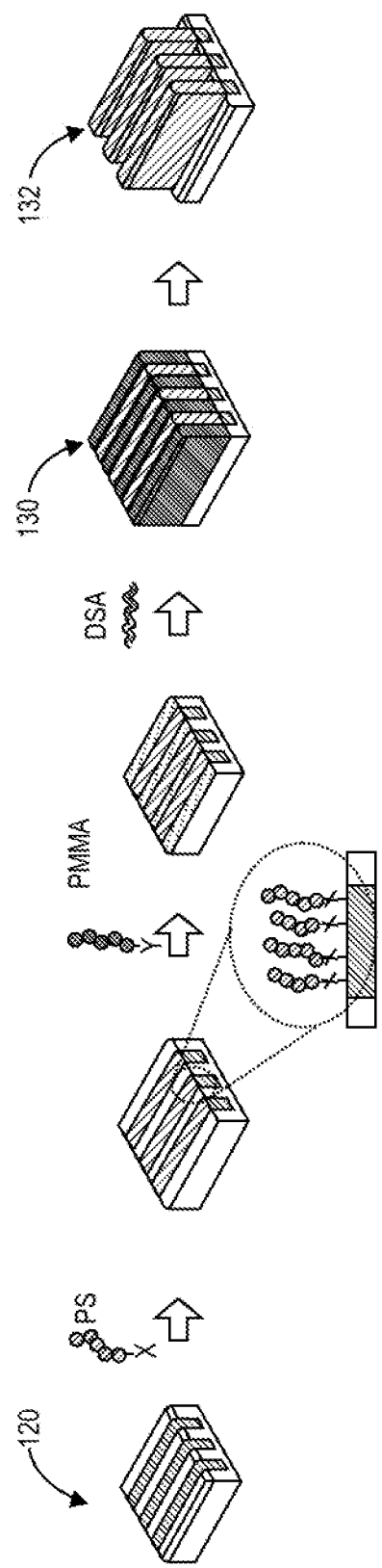
FIG. 3 graphically illustrates that the pattern of the grating may be replicated by DSA components by selectively grafting the first polymer component (e.g., PS) onto the metal and the second polymer component (e.g., PMMA) onto the ILD.

FIG. 3 graphically illustrates that the pattern of the gratings 120 may be replicated by DSA components by selectively grafting the first polymer component (e.g., PS) onto the metal and the second polymer component (e.g., PMMA) onto the ILD. Once the two polymer components are annealed, the polymer components will segregate depending on the fractions of the first polymer component relative to the second polymer component, causing the block copolymers to self-align along guide structures, such as metal grating, photoresist or other material. Molecules of the DSA block copolymers consistently align in alternating lines of a single consistent BCP pitch to form a DSA grating 130. In one embodiment, block copolymers can be formulated in a symmetric 50:50 volume ratio that produces Lamellar self-assembled domains. In other embodiments, a 60:40 or 40:60 blend may be used. In one embodiment, the block copolymers are configured to produce alternating lines of PS and PMMA with a BCP pitch of less than 80 nm, for example 10-50 nm.

Once the DSA grating 130 is formed, one of the block copolymers, such as PMMA, is removed from the DSA grating 130 and the remaining block copolymer (e.g., PS) can be used as a mask 132 for subsequent lithographic processing to replicate the pattern of the DSA grating 130. In one example, the DSA grating 130 can be replaced with the mask 132, which can then be replaced with a conductive material for via formation in selected areas. As another example, using the first polymer as a mask, channels can be etched into the substrate and then filled with a metal (or other conductive material) to define structures or features, such as interconnects for example in both the active regions 102 and the transition regions 104 of FIG. 1.

Figure 4C:
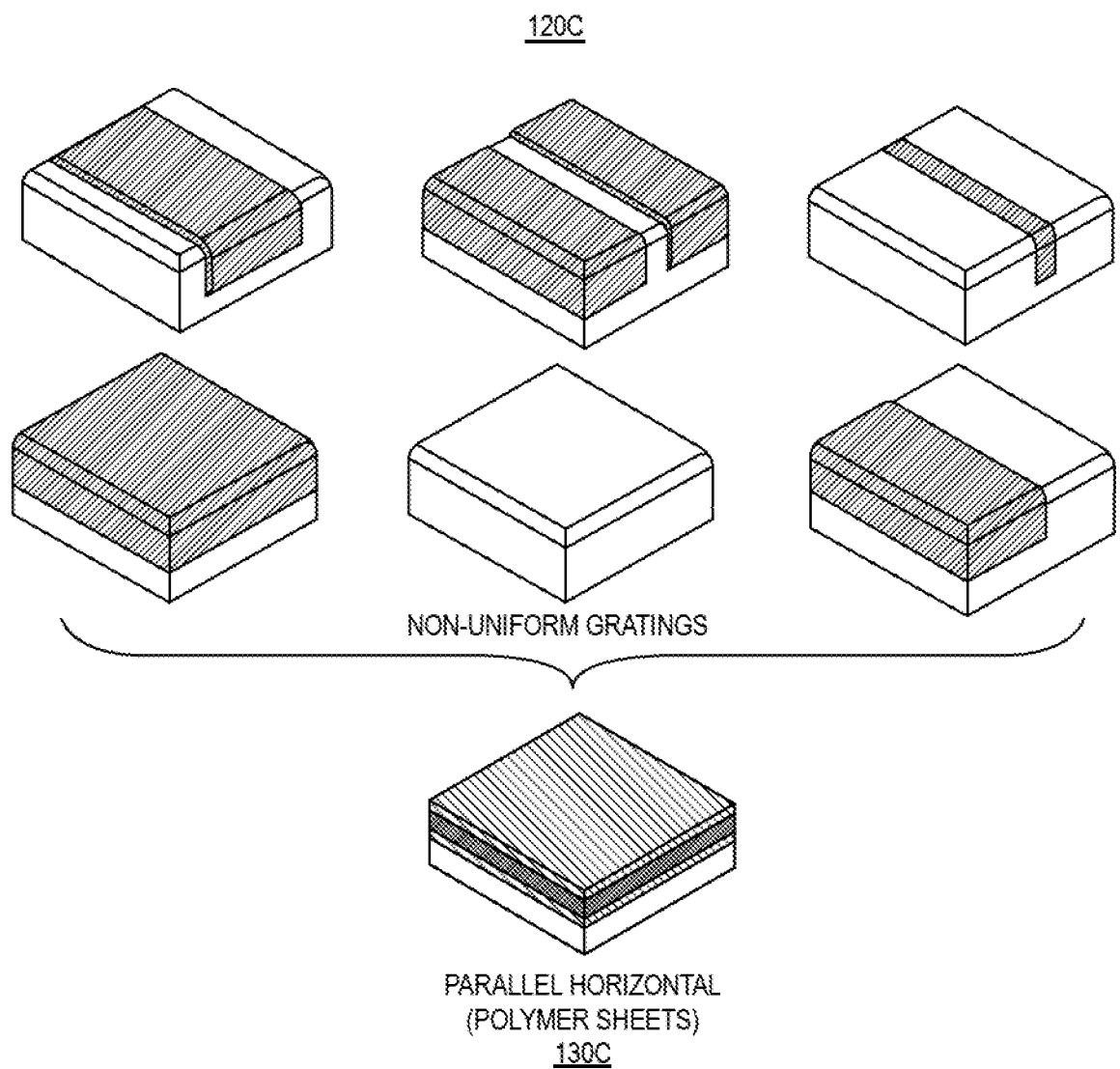

FIGS. 4A-4C illustrate possible BCP orientations that may result from the DSA process. Referring to FIG. 4A, when the grating pitch 400 of the metal grating 120A is close to or otherwise compatible to the BCP pitch 402 of the DSA grating, the DSA process provides aligned vertical BCP structures 130A. In one aspect of the present embodiments, aligned vertical BCP structures 130A is the desirable result when forming structures in both the active regions 102 and the transition regions 104 of FIG. 1.

However, a general challenge with DSA is that the molecules of the copolymers orient poorly along wide metal or ILD areas having dimensions that exceed a threshold compared to the self-assembled BCP pitch 402 and produce orientations considered defects, as shown in FIGS. 4B and 4C.

FIG. 4B shows that when the grating pitch 400 of the metal grating 120B is still uniform, but does not match the BCP pitch 402 of the DSA grating and the ratio of metal to ILD is close to 50:50, the DSA process provides random vertical BCP structures 130B called fingerprints. In one aspect of the present embodiments, random vertical BCP structures 130B or fingerprints resulting from the DSA process is acceptable in the transition regions 104 of FIG. 1.

FIG. 4C shows that when the surface area of either the metal or the ILD in the metal grating 120C is significantly larger than the other, or has a dimension that exceeds a threshold compared to the BCP pitch 402, then the molecules of the copolymers orient poorly in wide areas, and the copolymers tend to provide parallel horizontal BCP structures 130C, referred to as parallel horizontal polymer sheets or just polymer sheets. In one aspect of the present embodiments, parallel horizontal BCP structures 130B or polymer sheets is a result of DSA that is unacceptable when forming structures in either the active regions 102 or the transition regions 104 of FIG. 1.

FIGS. 4A and 4B illustrate uniform gratings that are compatible with the BCP pitch 402, while FIG. 4C illustrates examples of non-uniform gratings that are incompatible with the BCP pitch 402. The vertical random BCP structure 130B or fingerprints is acceptable because after the DSA process, one of the aligned random PS and PMMA components is removed (e.g., PMMA) to create a PS-only grating. A down flow process is then able to insert a metal or other material between these PS piers to form an IC structure, such as a conductive trace or interconnect. The parallel horizontal BCP structures 130C or polymer sheets of FIG. 4C are not acceptable because the down flow process can only remove one of the BCP components as the other will be covered. The down flow process simply deposits a nitride or oxide film on top of the remaining horizontal polymer sheet, which remains in the completed IC. An example of a polymer sheet defect within a completed IC is shown in FIGS. 5A and 5B.

Figure 5A:
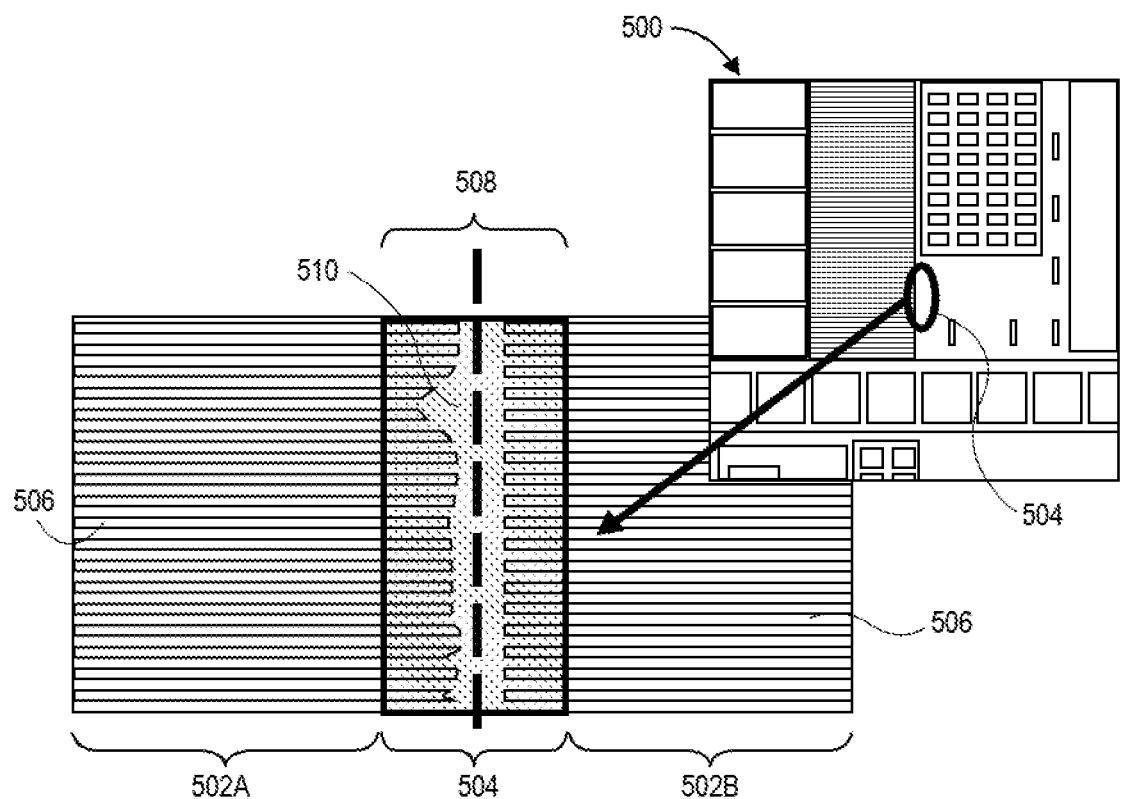
FIGS. 5A and 5B illustrate an IC fabricated with DSA in a manner that results in the presence of a polymer sheet defect.
Figure 5B:
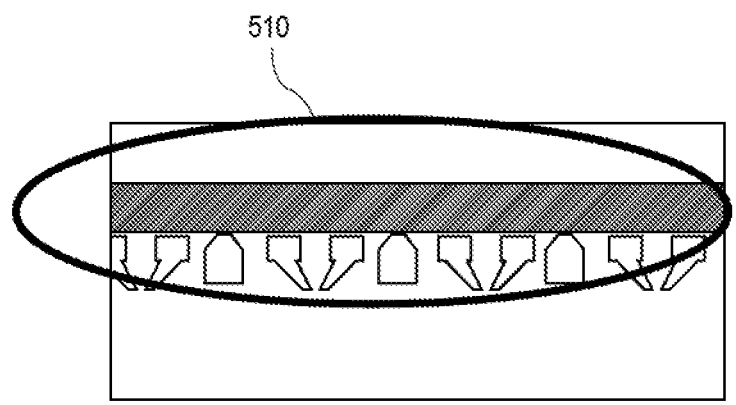

FIGS. 5A and 5B illustrate an IC 500 fabricated with DSA in a manner that results in the presence of a polymer sheet defect. FIG. 5A illustrates a top view of an IC 500 and an enlarged view 504 shows active regions 502A and 502B (collectively referred to as active regions 502) separated by a transition region 504. FIG. 5B illustrates a cross-section view of the transition region 504, which includes polymer sheet 510. As can be seen, the active regions 502 were designed with uniform gratings 506 that were easily replicated by DSA process to create aligned vertical BCP structures used to create a uniform pattern of actual metal/ILD interconnects. However, the transition region 504 was designed with a non-uniform grating 508 that has relatively large breaks. The breaks are too wide for the DSA process to follow and results in the formation of a polymer sheet 510. Since such horizontal structures are not easily removed, a significant amount of polymer is left on the wafer during down flow processing. Down flow processes are high temperature processes and resultant polymer out flow gases can cause delamination and other problems for the IC.

According to the disclosed embodiments, materials and layout design options for DSA fabrication of integrated circuits in a manner that significantly reduces or eliminates the presence of polymer sheets is described. One or more embodiments described herein are directed to integrated circuit structure (IC) formed with DSA approaches in which active regions and transition regions are formed on a die. The active regions comprise uniform gratings of metal and dielectric materials that are DSA compatible and consist of vertically aligned structures, while the transition regions comprise at least one of uniform gratings having vertical aligned structures, and non-uniform gratings having vertical random structures (referred to as fingerprints). Both the active regions and the transition regions have an absence of non-uniform gratings with horizontal parallel polymer sheets thereon, which are known to cause defects.

Figure 6A:
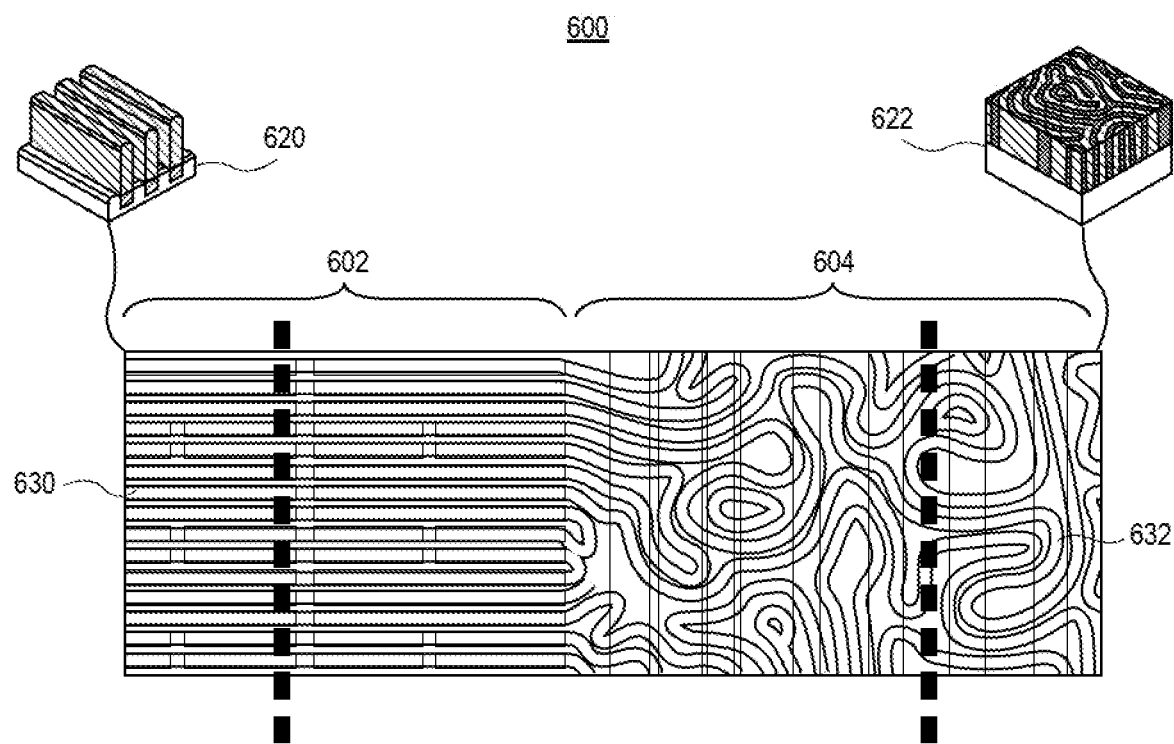
FIGS. 6A-6C illustrate IC fabricated with DSA in a manner that significantly reduces or eliminates the presence of polymer sheets.
Figure 6B:
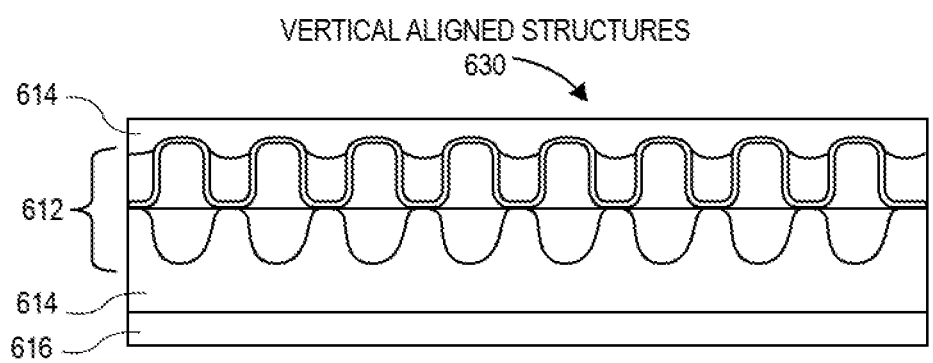
Figure 6C:
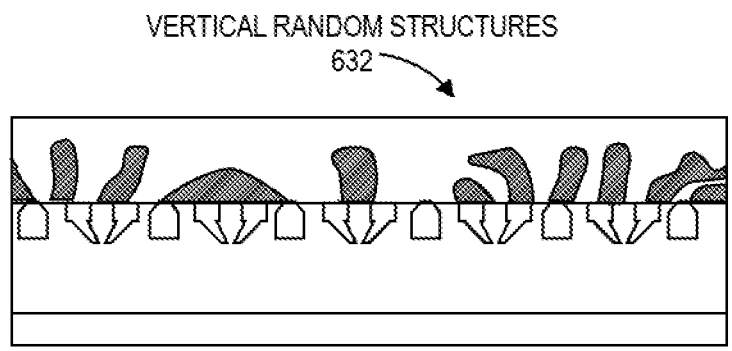

FIGS. 6A-6C illustrate IC 600 fabricated with DSA in a manner that significantly reduces or eliminates the presence of polymer sheets. FIG. 6A illustrates a top view of the IC 600 through the BCP so that the pattern of underlying metal/ILD grating 620 and 622 are shown in an active region 602 and an adjacent transition region 604. FIG. 6B illustrates a cross-section of the active region 602, and FIG. 6C illustrates a cross-section view of the transition region 604.

Vertical aligned structures 630 and the vertical random structures 632 may result from one of the BCP components being removed and replaced with first a hard mask (e.g., oxide, nitride, carbon hard mask material and the like), which will then be replaced with a metal or other conductive material, such as aluminum, copper, titanium, or other suitable metal for via formation, for example. The present disclosure contemplates the vertical aligned structures 630 and the vertical random structures 632 being formed in, or including, one or more layers of an integrated circuit architecture. For example, the vertical aligned structures 630 and the vertical random structures 632 can be formed on a base layer or substrate, formed in a semiconductor material layer common to various semiconductor devices, formed in an inter-layer dielectric (ILD) material layer that is coplanar with or vertically above semiconductor material layers, formed in an interconnect layer, or formed in a metallization layer or via layer vertically above the semiconductor material layer(s), to name a few examples.

In the example shown in FIGS. 6B and 6C, the vertical aligned structures 630 and the vertical random structures 632 are formed in a via layer 612 between metallization layers 614, each of which is located vertically above a semiconductor material layer 616. Additional material layers may exist above or below the layers shown in FIG. 5. The via layer 612 and metallization layers 614 each comprise a dielectric material, such as silicon dioxide ($SiO_2$) titanium nitride (TiN), silicon nitride ($Si_3N_4$) or other suitable dielectric material.

According to the disclosed embodiments, a first layout design rule constraint is defined requiring that the active regions of IC 600 comprise a first grating 620 of metal and dielectric materials with only vertically aligned structures thereon. A second layout design rule constraint is defined requiring that the transition region 604 adjacent to the active region 602 comprise a second grating 622 of metal and dielectric materials having at least one of vertical aligned structures 630 and vertical random structures thereon 632. Accordingly, both the first grating 620 and the second grating 622 comprise uniform gratings compatible with DSA. Consequently, the active region 602 and the transition region 604 have an absence of non-uniform gratings with horizontal parallel polymer sheets thereon, which may be considered a third layout design rule constraint.

According the one aspect of the disclosed embodiments, prior to fabrication of the IC 600, the modified layout design rules are enforced such that a width of the isolated metal or ILD comprising the first grating 620 of active region 602 is less than approximately 0.15 to 0.25 times a grating pitch of the first grating 620 in order for the first grating 620 to be considered uniform and DSA compatible, or approximately 0.20 times a grating pitch of the grating 620 in a specific embodiment. Alternatively or in addition to, the modified layout design rules are enforced such that dummy structures are inserted into the first grating 620 to make the grating pitch within approximately +/−20% of the BCP pitch, or approximating +/−10% of the BCP pitch for A-B type copolymers and within approximating +/−60% of the BCP pitch for A-B-A type copolymers.

Similarly, the modified layout design rules were enforced with respect to the transition region 604 such that a width of the isolated metal or ILD comprising the second grating 622 is less than approximately 0.15 to 0.25 times a grating pitch of the grating 622 or approximately 0.20 times a grating pitch of the grating 620 in a specific embodiment. Alternatively or in addition to, the modified layout design rules are enforced such that dummy structures were inserted into the second grating 622 to make the grating pitch less than approximately +/−10% of the BCP pitch for A-B type copolymers and within approximating +/−40% of the BCP pitch for A-B-A type copolymers.

The layout design rule constraints embodiments disallow polymer sheet defects in both the active regions 602 (i.e., "care regions") and transition regions 604 (i.e., "don't care regions") of the die arising from non-uniform gratings that are incompatible with BCP pitch. However, the layout design rule constraints optionally allow defects only in the transition regions 604 ("don't care regions"), where the defect arises from uniform gratings that cause DSA to form vertical random structures, rendering any such defects harmless. The layout design rule constraints further require active regions 602 to have uniform gratings that result only in formation of aligned vertical metal structures. The active regions 602 are consequently relatively clean, in that they are defect-free or otherwise free of defects comparable to defects in the don't care regions or that otherwise would be considered problematic with respect to performance and reliability issues. As used in this disclosure, the term defect-free is a relative term, and is not intended to be interpreted as requiring true perfection. In particular, some degree of acceptable or minor defect may be present, but relative to other more severe defects, are a non-issue with respect to factors such as device performance and reliability. Similarly, the word "vertical" with respect to aligned and random aligned structures does not necessarily mean 90 degrees with respect to the substrate, but includes a tolerance within +/−5 degrees.

In one aspect of the disclosed embodiments, the goal is to ensure a layout design for an IC only includes uniform gratings compatible with DSA. This may be accomplished by analyzing one or more layout designs for the active regions and the transition regions to identify areas having non-uniform gratings that are incompatible with DSA.

As used herein, a non-uniform grating is one having metal/ILD dimensions and ratios that are not within certain thresholds compared to the BCP pitch 400 and produce BCP orientations that result in horizontal polymer sheets, as shown in FIG. 4C, which are not BCP compatible. A uniform grating is one having metal/ILD dimensions and ratios that are within certain thresholds compared to the BCP pitch 400 and produce BCP orientations that result in formation of vertical structures (vertical aligned or vertical random), as shown in FIGS. 4A and 4B. Such uniform gratings are considered compatible with BCP pitch.

More specifically, a non-uniform grating capable of polymer sheet formation is found by identifying an area in an active region or transition region having: i) isolated metal or ILD width greater than a first threshold of 0.75 to 0.85 times a grating pitch 400 of the metal grating 620, or ii) a grating pitch that is not within a second threshold of approximately +/−10% of the BCP pitch for A-B type copolymers and not within approximating +/−60% of the BCP pitch for A-B-A type copolymers. In other embodiments, the first threshold is 0.80 times a grating pitch and a non-uniform grating is defined as an area with a grating pitch that is not within approximately +/−10% or 20% of the BCP pitch.

Once an area is identified having a non-uniform grating, the layout design of that area is modified such that non-uniform grating is made uniform and compatible with DSA. The layout designs for areas identified as having the non-uniform gratings are modified to either: i) reduce the width of metal or ILD comprising the non-uniform grating that is too wide and incompatible with DSA or ii) to insert dummy structures in the layout designs to convert the non-uniform gratings to DSA-compatible uniform gratings. The first option is to redesign structures to reduce width. For example, a metal or ILD line originally designed with a width of 100 nm can be redesigned with a reduced with of less than −75-85 nm to accommodate DSA. In the second option, dummy structures such as plugs may be used is to reduce the size of a metal or ILD structure such that the amount of metal and ILD in a particular area are as proportionate as possible, e.g. 50:50.

The modified layout designs ensure fabrication of an IC having active regions and transitions regions in which: i) the active regions consist of vertical aligned structures, ii) the transition regions consists of at least one of vertical aligned structures and vertical random structures, and iii) no horizontal polymer sheets in either the active regions or the transition regions.

Figure 7:
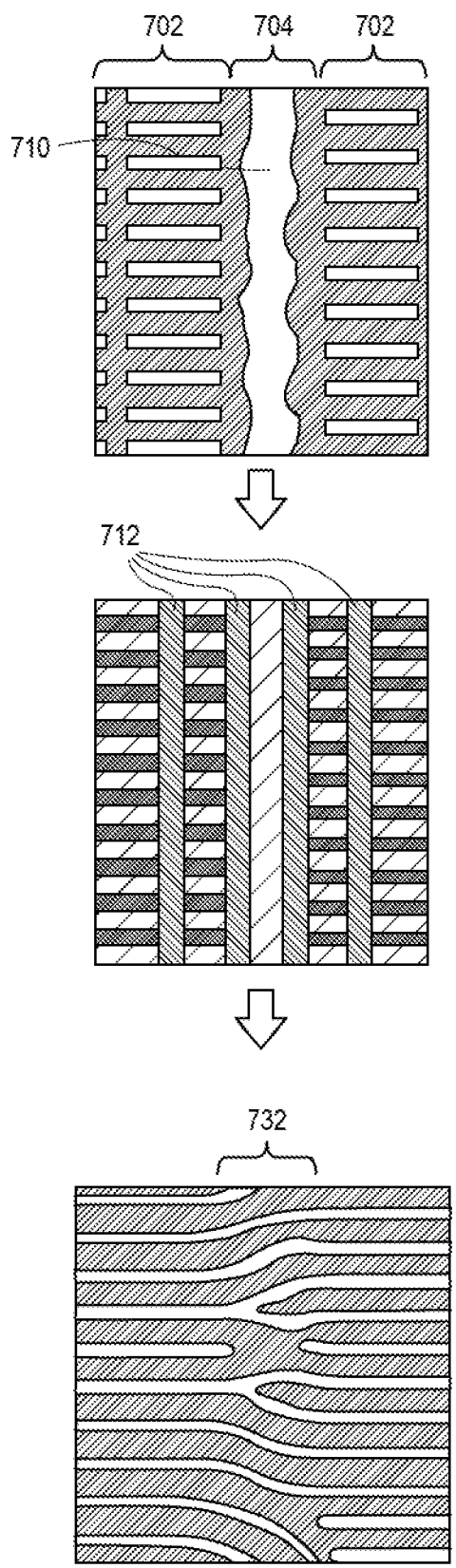
FIG. 7 illustrates an example of a modification made to a transition region to convert a non-uniform grating into a DSA-compatible uniform grating.

FIG. 7 illustrates an example of a modification made to a transition region to convert a non-uniform grating into a DSA-compatible uniform grating. A top view of an example transition region 704 as it would appear prior to DSA is shown between two active regions 702 having different pitches. The transition region 704 comprises a metal structure 710 that is too wide for compatibility with DSA. To avoid formation of polymer sheets, the layout design for the transition region 704 is modified to incorporate a plug mask to pattern resist such that dummy structures referred to as plugs 712 are inserted to convert the metal structure 710 into a DSA-compatible uniform grating. Plug patterning is also used in fabrication process flow, but typically, process flow designs are not DSA friendly. Here, the use of the plugs 712 is to break the wide metal structure 710 into smaller metal structure/features that have a pitch within approximately ±10% BCP pitch for A-B type copolymers and within 60% for A-B-A type copolymers to create a DSA compatible layout design that avoids polymer sheet formation, and results in the formation of vertical random structures 732 in this example. In one embodiment, the use of plugs 712 is to reduce the size of a metal or ILD structure such that that metal and ILD have approximately the same proportion.

Figure 8B:
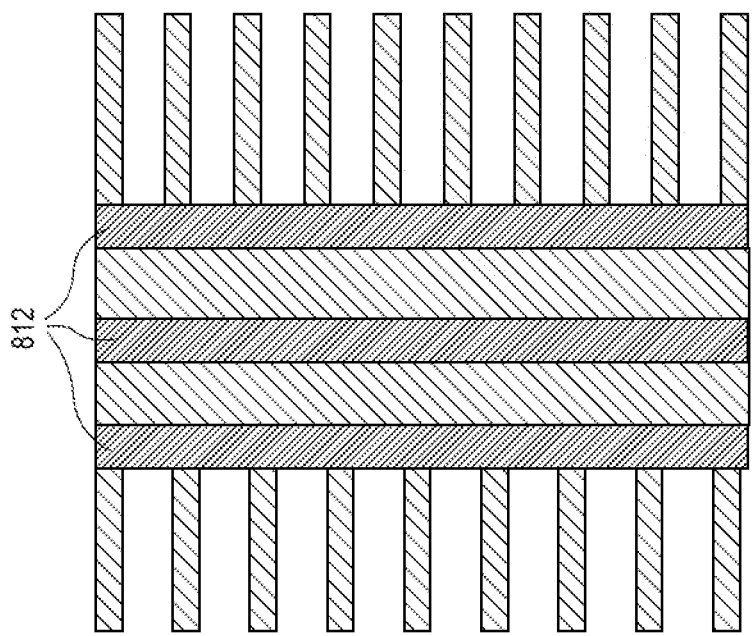
FIGS. 8A-8D illustrate various example plug mask configurations to convert DSA incompatible gratings into DSA compatible gratings.
Figure 8A:
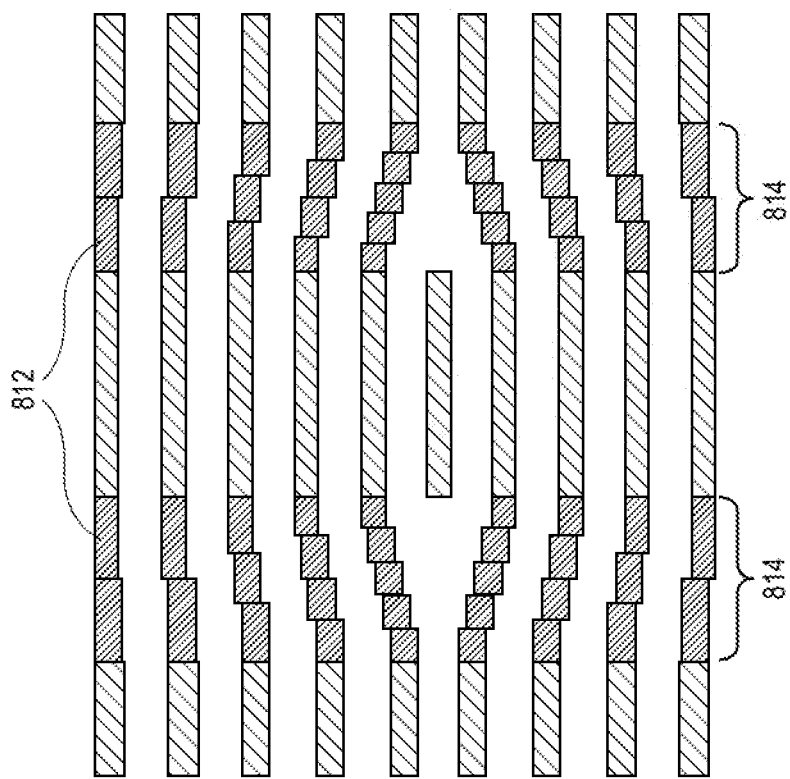

FIGS. 8A-8D illustrate various example plug mask configurations to convert DSA incompatible gratings into DSA compatible gratings. FIG. 8A shows an example use of plugs 812 arranged in an offset formation to form jog structures 814 between gratings of different pitch, rather than using a single wide structure. In one embodiment, each plug 812 jog structures 814 is approximately 30-50 nm in length.

FIG. 8B shows an example use of plugs 812 in a transition region laid out perpendicular between two active regions, where the plugs are parallel narrow rectangles over a wide metal/ILD to reduce the metal/ILD width. If for example, the BCP pitch is 50 nm, then according to an embodiment where DSA can handle a grating pitch within 10% of the BCP pitch for A-B type copolymers. The addition of the plugs 812 ensures the transition region has a grating a pitch anywhere between 45 nm and 55 nm.

Figure 8D:
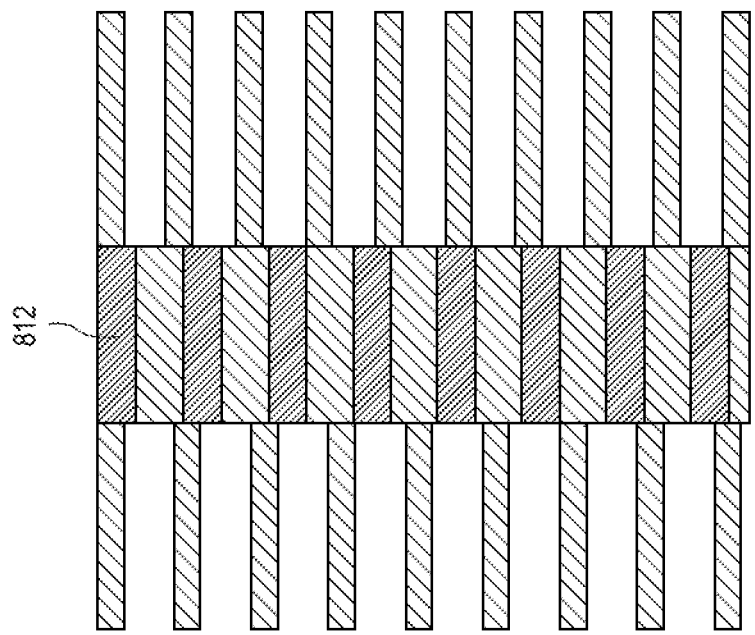
Figure 8C:
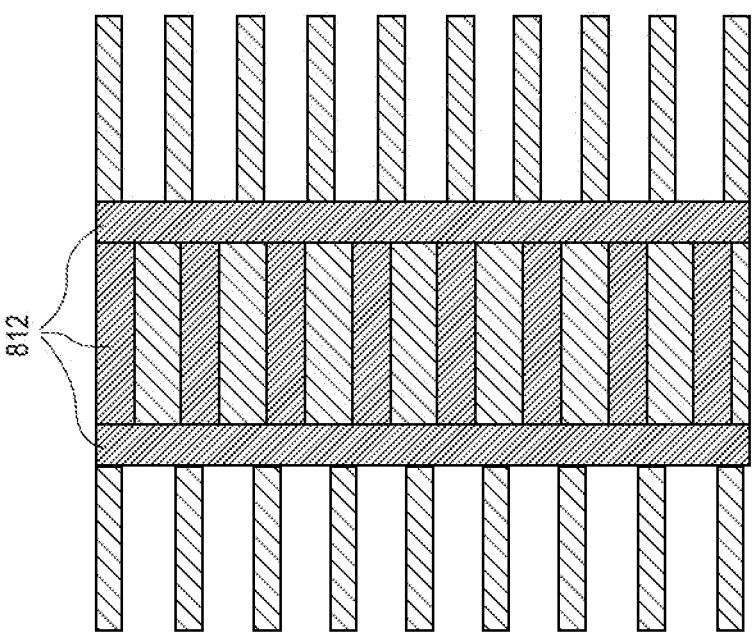

FIG. 8C shows an example use of plugs 812 in a transition region laid out parallel between two active regions. In this example, the plugs are arranged in a "ladder" formation over a wide metal/ILD region to make the transition region pitch within 10% of the BCP pitch.

FIG. 8D shows another example use of plugs 812 in a transition region laid out parallel between two active regions in which the metal/ILD grating and the plugs to not align exactly with the gratings of the active regions. In this case, DSA may result in formation of fingerprints over the transition region, which is still acceptable as vertical structures can still be formed from DSA fingerprints.

The embodiments above describe a material approach for avoiding formation of parallel horizontal BCP structures. According to a further aspect of the disclosed embodiments, a chemical approach for avoiding formation of parallel horizontal BCP structures is described. In this approach rather than selectively grafting a first polymer component (e.g., PS) onto the metal and the second polymer component (e.g., PMMA) onto the ILD or vice versa, the chemical embodiment selectively grafts either PS or PMMA onto the metal and a neutral polymer component onto the ILD. Such an approach can reduce parallel orientation over wide metal gratings 120C, as shown in FIG. 4C.

According the disclosed embodiments, the process for fabricating an IC with DSA may begin by receiving a substrate with one or more active regions separated by transition regions. For example, the substrate can be a semiconductor wafer with a plurality of active regions and transition regions distributed across the wafer in a grid, each active region containing devices, integrated circuits, and/or sensors. In another example, the substrate comprises a semiconductor layer with at least one active region containing one or more semiconductor device. Lamellae-forming block copolymers are provided for DSA. In embodiments, the block copolymers are polystyrene and polymethyl methacrylate (PS-b-PMMA) in a solvent or carrier liquid. However, in other examples, any other appropriate type of polymers may also be used. Examples of such polymers include, but are not limited to, poly(styrene)-b-poly(2-vinylpyridine) (PS-b-P2VP), poly(styrene)-b-poly(4-vinylpyridine) (PS-b-P4VP), poly(styrene)-b-poly(acrylic acid) (PS-b-PAA), poly(styrene)-b-poly(ethylene glycol) (PS-b-PEG), poly(styrene)-b-poly(imide) (PS-b-PI), and poly(styrene)-b-poly(dimethylsiloxane) (PS-b-PDMS). These systems and their processing may be at least in part analogous to the BCP comprising the PS-b-PMMA system discussed herein. In one example, annealing the block copolymers solution causes molecules of the DSA copolymer solution self-align to form alternating lines of polystyrene and polymethyl methacrylate. In some embodiments, the alternating lines of polymers have a BCP pitch of less than 80 nm or less than 50 nm. Numerous other suitable DSA solutions can be used, as will be appreciated.

The process continues with defining one or more gratings on the substrate, wherein the grating pitch is within 10% of the BCP pitch for A-B type copolymers or 60% of the BCP pitch for A-B-A type copolymers. In one embodiment, the grating includes lines of photoresist that define one or more structures. For example, when the BCP pitch is 50 nm, the grating has a grating pitch of 45-55 nm. The gratings can be formed using any suitable wet or dry photolithography technique, as will be appreciated. In one example process, photoresist is spin-coated onto the substrate, a mask is used during exposure to ultraviolet light to polymerize certain regions of the photoresist, and the non-polymerized regions of photoresist are removed with a solvent. The lithographic process leaves spaced-apart lines of photoresist on the substrate in a pattern that can be used to guide alignment of molecules of the block copolymer solution. When lines of the pinning stripe structure are spaced to within a threshold 10 or 60% of the BCP pitch (depending on the type of copolymers), the block copolymers align consistently to the pinning stripe structure.

The process continues with depositing the block copolymer DSA solution on the substrate and the gratings. In some embodiments, the DSA solution is spin coated onto the substrate. In other embodiments, the DSA solution is sprayed, sputtered, dripped, or otherwise applied to the substrate.

The process continues with annealing the DSA solution. For example, a PS-b-PMMA block copolymer solution can be annealed using a solvent vapor annealing (SVA) process with acetone, tetrahydrofuran (THF), or other suitable solvent. In another example, the PS-b-PMMA block copolymer solution can be annealed by heating at a temperature sufficient to vaporize the solvent, such as about 170° C. to about 230° C. During the annealing process, the molecules of the block copolymers align along the gratings to define alternating lines of the block copolymers. For example, in the active regions the polymers consistently define alternating parallel lines of a first polymer (e.g., PS) and a second polymer (e.g., PMMA) that form aligned vertical BCP structures without defects. In the transition regions, when the grating pitch of the grating is still uniform, but does not match the BCP pitch, but the ratio of PS to PMMA is close to 50:50, the first and second polymers may form random vertical BCP structures. Aligned vertical BCP structures may also be formed in the transition regions. At no point parallel horizontal BCP structures or polymer sheets formed.

The process continues with removing one of the block copolymers. For example, a suitable solvent is selected to remove the first block copolymers (e.g., PS) and leave the second block copolymer (e.g., PMMA) on the substrate. The second block copolymer can be used as a mask for subsequent processing.

The process continues with etching trenches in the material previously covered by the first copolymer. In one embodiment, the block copolymer solution is applied on a dielectric material of a via layer or a metallization layer, such as silicon dioxide or titanium nitride. The trenches can be formed using any suitable wet or dry etching process.

The process continues with depositing a metal, semiconductor, or other material in the etched trenches and planarizing as needed to define the structures such as traces or interconnects. In one embodiment where the structures are formed in a via layer or metallization layer, copper, aluminum, titanium, or other conductive metal is deposited. In other embodiments in which the structures are formed in one or more semiconductor material layers, a doped semiconductor material can be deposited in the trench. For example, n-type semiconductor material is deposited into trenches formed in a p-type semiconductor material layer, or vice versa.

The process may continue with performing down flow die processing, including packaging processes.

In some embodiments, the process can be performed during or after back-end or back-end-of-line (BEOL) processing, for example. In other embodiments, method can be performed in a front-end-of-line (FEOL) processing, such as after or during formation of semiconductor devices, as will be appreciated. Note that processes are shown in a particular order for ease of description. However, one or more of the processes may be performed in a different order or may not be performed at all (and thus be optional), in accordance with some embodiments. There are numerous variations on the process and techniques described herein.

The integrated circuit structures described herein may be included in an electronic device. As an example of one such apparatus, FIGS. 9A and 9B are top views of a wafer and dies that include one or more embedded non-volatile memory structures utilizing direct self-assembly process for formation of selector or memory layers, in accordance with one or more of the embodiments disclosed herein.

Figure 9B:
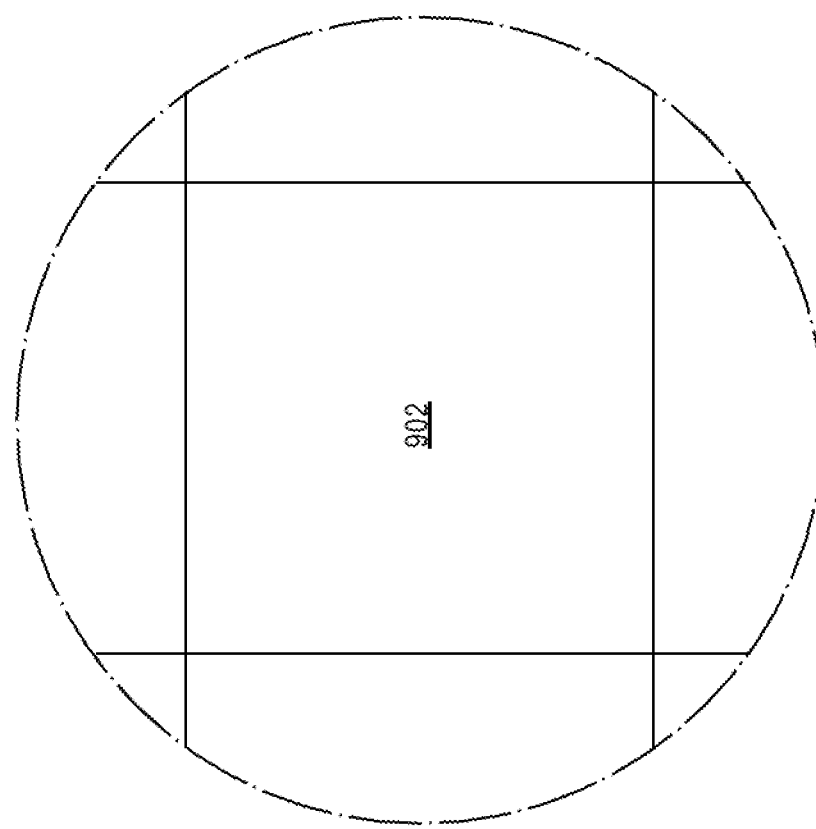
FIGS. 9A and 9B are top views of a wafer and dies that include one or more embedded non-volatile memory structures utilizing direct self-assembly process for formation of selector or memory layers, in accordance with one or more of the embodiments disclosed herein.
Figure 9A:
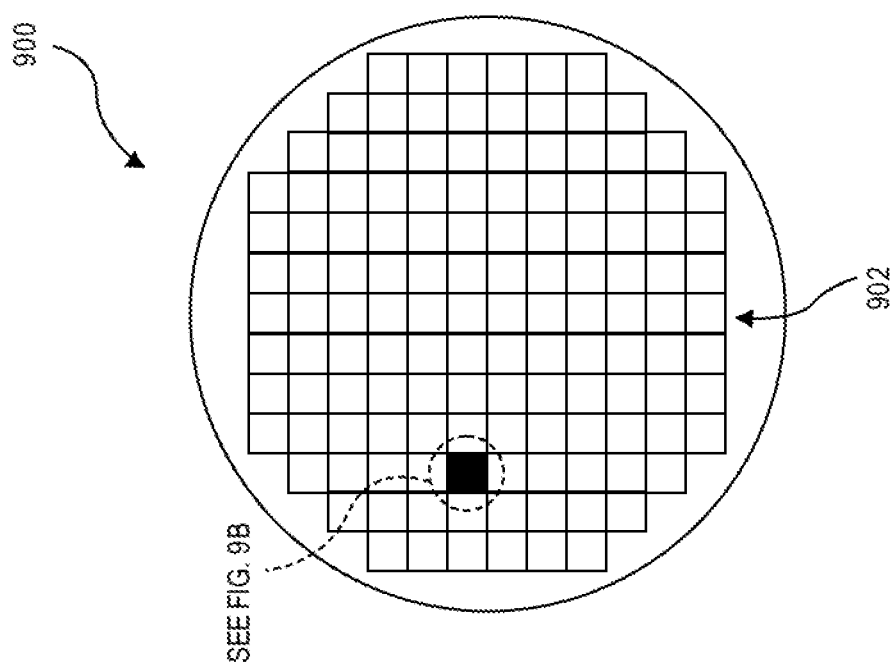

Referring to FIGS. 9A and 9B, a wafer 900 may be composed of semiconductor material and may include one or more dies 902 having integrated circuit (IC) structures formed on a surface of the wafer 900. Each of the dies 902 may be a repeating unit of a semiconductor product that includes any suitable IC (e.g., ICs including one or more active regions and transitions having only vertical structures formed by DSA, such as described above. After the fabrication of the semiconductor product is complete, the wafer 900 may undergo a singulation process in which each of the dies 902 is separated from one another to provide discrete "chips" of the semiconductor product. In particular, structures that include traces or interconnects in active regions and transitions having only vertical structures formed by DSA as disclosed herein may take the form of the wafer 900 (e.g., not singulated) or the form of the die 902 (e.g., singulated). The die 902 may include one or more active regions and transitions having only vertical structures formed by DSA and/or supporting circuitry to route electrical signals, as well as any other IC components. In some embodiments, the wafer 900 or the die 902 may include an additional memory device (e.g., a static random access memory (SRAM) device), a logic device (e.g., an AND, OR, NAND, or NOR gate), or any other suitable circuit element. Multiple ones of these devices may be combined on a single die 902. For example, a memory array formed by multiple memory devices may be formed on a same die 902 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
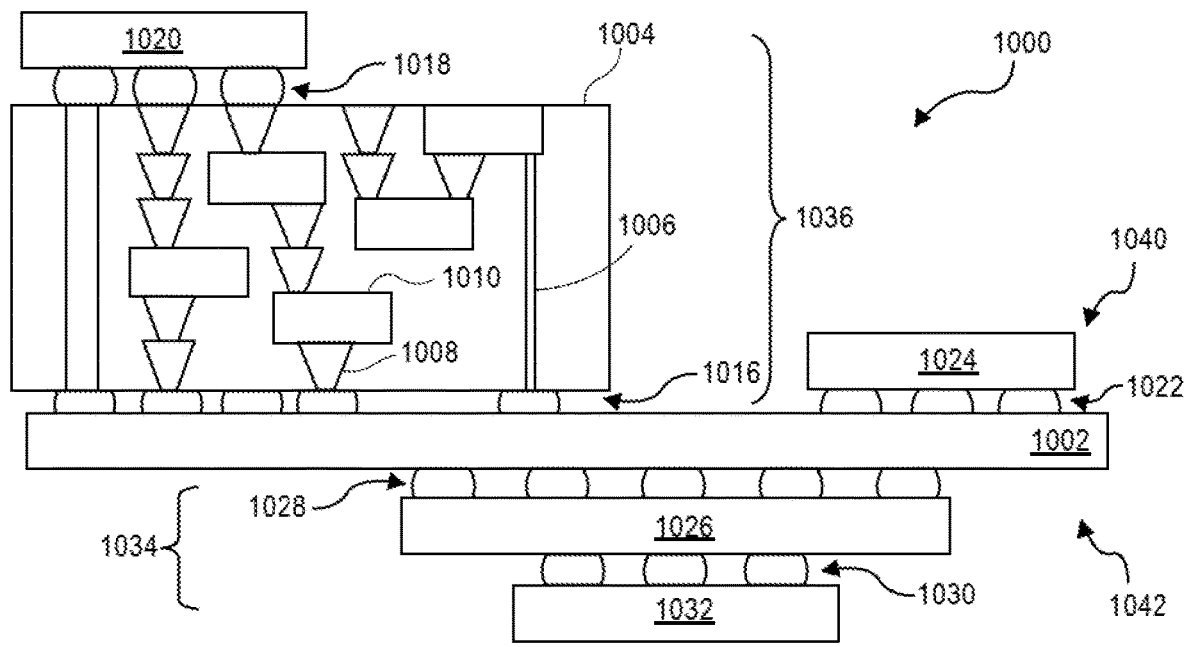
FIG. 10 is a cross-sectional side view of an integrated circuit (IC) device assembly that may include one or more embedded non-volatile memory structures utilizing direct self-assembly process for formation of selector or memory layers, in accordance with one or more of the embodiments disclosed herein.

FIG. 10 is a cross-sectional side view of an integrated circuit (IC) device assembly that may include one or more active regions and transitions having only vertical structures formed by DSA, in accordance with one or more of the embodiments disclosed herein.

Referring to FIG. 10, an IC device assembly 1000 includes components having one or more integrated circuit structures described herein. The IC device assembly 1000 includes a number of components disposed on a circuit board 1002 (which may be, e.g., a motherboard). The IC device assembly 1000 includes components disposed on a first face 1040 of the circuit board 1002 and an opposing second face 1042 of the circuit board 1002. Generally, components may be disposed on one or both faces 1040 and 1042. In particular, any suitable ones of the components of the IC device assembly 1000 may include a number of active regions and transitions having only vertical structures formed by DSA, such as disclosed herein.

In some embodiments, the circuit board 1002 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate.

The IC device assembly 1000 illustrated in FIG. 10 includes a package-on-interposer structure 1036 coupled to the first face 1040 of the circuit board 1002 by coupling components 1010. The coupling components 1010 may electrically and mechanically couple the package-on-interposer structure 1036 to the circuit board 1002, and may include solder balls (as shown in FIG. 10), male and female portions of a socket, an adhesive, an underfill material, and/or any other suitable electrical and/or mechanical coupling structure.

The package-on-interposer structure 1036 may include an IC package 1020 coupled to an interposer 1004 by coupling components 1018. The coupling components 1018 may take any suitable form for the application, such as the forms discussed above with reference to the coupling components 1018. Although a single IC package 1020 is shown in FIG. 10, multiple IC packages may be coupled to the interposer 1004. It is to be appreciated that additional interposers may be coupled to the interposer 1004. The interposer 1004 may provide an intervening substrate used to bridge the circuit board 1002 and the IC package 1020. The IC package 1020 may be or include, for example, a die (the die 902 of FIG. 9B), or any other suitable component. Generally, the interposer 1004 may spread a connection to a wider pitch or reroute a connection to a different connection. For example, the interposer 1004 may couple the IC package 1020 (e.g., a die) to a ball grid array (BGA) of the coupling components 1016 for coupling to the circuit board 1002. In the embodiment illustrated in FIG. 10, the IC package 1020 and the circuit board 1002 are attached to opposing sides of the interposer 1004. In other embodiments, the IC package 1020 and the circuit board 1002 may be attached to a same side of the interposer 1004. In some embodiments, three or more components may be interconnected by way of the interposer 1004.

The interposer 1004 may be formed of an epoxy resin, a fiberglass-reinforced epoxy resin, a ceramic material, or a polymer material such as polyimide. In some implementations, the interposer 1004 may be formed of alternate rigid or flexible materials that may include the same materials described above for use in a semiconductor substrate, such as silicon, germanium, and other group III-V and group IV materials. The interposer 1004 may include metal interconnects 1010 and vias 1008, including but not limited to through-silicon vias (TSVs) 1006. The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art.

The IC device assembly 1000 may include an IC package 1024 coupled to the first face 1040 of the circuit board 1002 by coupling components 1022. The coupling components 1022 may take the form of any of the embodiments discussed above with reference to the coupling components 1010, and the IC package 1024 may take the form of any of the embodiments discussed above with reference to the IC package 1020.

The IC device assembly 1000 illustrated in FIG. 10 includes a package-on-package structure 1034 coupled to the second face 1042 of the circuit board 1002 by coupling components 1028. The package-on-package structure 1034 may include an IC package 1026 and an IC package 1032 coupled together by coupling components 1030 such that the IC package 1026 is disposed between the circuit board 1002 and the IC package 1032. The coupling components 1028 and 1030 may take the form of any of the embodiments of the coupling components 1018 discussed above, and the IC packages 1026 and 1032 may take the form of any of the embodiments of the IC package 1020 discussed above. The package-on-package structure 1034 may be configured in accordance with any of the package-on-package structures known in the art.

Figure 11:
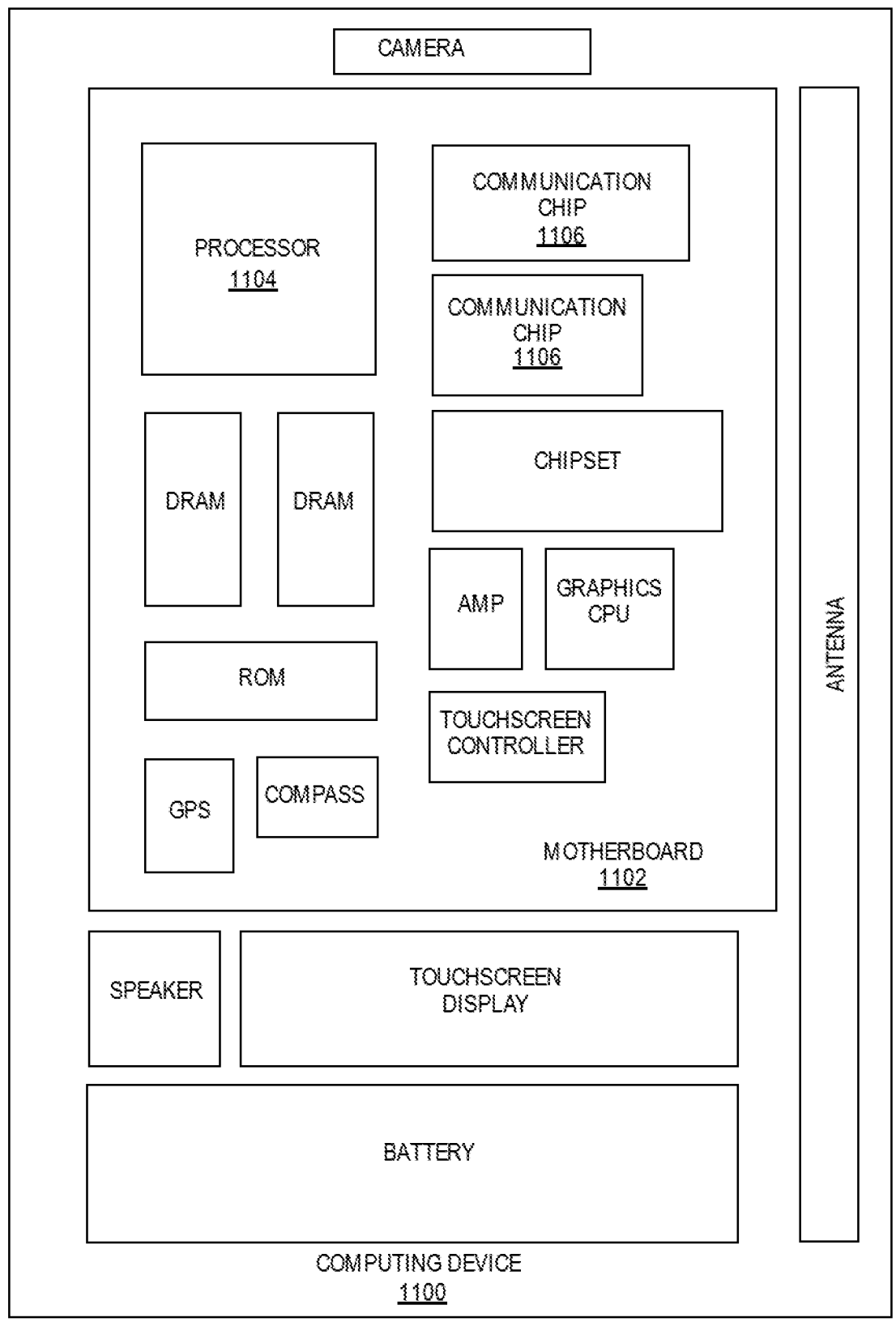
FIG. 11 illustrates a computing device 1100 in accordance with one implementation of the disclosure.

FIG. 11 illustrates a computing device 1100 in accordance with one implementation of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the disclosure, the integrated circuit die of the processor includes one or more active regions and transitions having only vertical structures formed by DSA, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of embodiments of the disclosure, the integrated circuit die of the communication chip includes one or more active regions and transitions having only vertical structures formed by DSA, in accordance with implementations of embodiments of the disclosure.

In further implementations, another component housed within the computing device 1100 may contain an integrated circuit die that includes one or more active regions and transitions having only vertical structures formed by DSA, in accordance with implementations of embodiments of the disclosure.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes an active region containing more active semiconductor devices, wherein the active region comprises a first grating of metal and dielectric materials with only vertically aligned structures thereon. A transition region containing inactive structures is adjacent to the active region, wherein the transition region comprises a second grating of metal and dielectric materials having at least one of vertical aligned structures and vertical random structures thereon Both the active regions and the transition regions have an absence of non-uniform gratings with horizontal parallel polymer sheets thereon.

Example embodiment 2: The integrated circuit structure of example embodiment 1, wherein a width of the metal and dielectric materials comprising the first grating of the active region is less than approximately 0.15 to 0.25 times a grating pitch of the first grating.

Example embodiment 3: The integrated circuit structure of example embodiment 2, wherein a width of the metal and dielectric materials comprising the first grating of the active region is approximately 0.20 times a grating pitch of the first grating.

Example embodiment 4: The integrated circuit structure of example embodiment 1, 2, or 3, wherein the active region further comprises: dummy structures in the first grating that make a grating pitch of the first grating within approximately +/−10% of a BCP pitch for A-B type copolymers and within approximating +/−40% of the BCP pitch for A-B-A type copolymers.

Example embodiment 5: The integrated circuit structure of example embodiment 1, 2, or 3, wherein dummy structures in the first grating make the grating pitch of the first grating within approximately +/−10% of a BCP pitch for A-B type copolymers and within approximating +/−40% of the BCP pitch for A-B-A type copolymers.

Example embodiment 6: The integrated circuit structure of example embodiment 4, or 5, wherein the BCP pitch is less than 80 nm.

Example embodiment 7: The integrated circuit structure of example embodiment 6, wherein the BCP pitch is 10-50 nm.

Example embodiment 8: The integrated circuit structure of example embodiment 1, wherein a width of the metal and dielectric materials comprising the second grating of the transition region is less than approximately 0.15 to 0.25 times a grating pitch of the second grating.

Example embodiment 9: The integrated circuit structure of example embodiment 8, wherein a width of the metal and dielectric materials comprising the second grating of the transition region is approximately 0.20 times a grating pitch of the second grating.

Example embodiment 10: The integrated circuit structure of example embodiment 1, 2, 3, 4, 5, 6, 7, 8, or 9, wherein the transition region further comprises: dummy structures in the second grating that make a grating pitch of the second grating within approximately +/−10% of a BCP pitch for A-B type copolymers.

Example embodiment 11: The integrated circuit structure of example embodiment 1, 2, 3, 4, 5, 6, 7, 8, 9, or 10, wherein dummy structures in the second grating make the grating pitch of the second grating within approximately +/−40% of the BCP pitch for A-B-A type copolymers.

Example embodiment 12: The integrated circuit structure of example embodiment 10 or 11, wherein the BCP pitch is less than 80 nm.

Example embodiment 13: The integrated circuit structure of example embodiment 10, wherein the BCP pitch is 10-50 nm.

Example embodiment 14: A method of fabricating an integrated structure (IC) using direct self-assembly (DSA) comprises analyzing one or more layout designs for the active regions and the transition regions to identify areas having non-uniform gratings that are incompatible with DSA. One or more of the layout designs are modified for the areas identified as having non-uniform gratings by at least one of: a) reducing a width of metal or dielectric material comprising the non-uniform grating that is too wide and incompatible with DSA; and b) inserting dummy structures into the non-uniform gratings to convert the non-uniform gratings into DSA-compatible uniform gratings in order to form: i) vertical aligned structures in the active regions, ii) at least one of vertical aligned structures and vertical random structures in the transition regions, and iii) no horizontal polymer sheets in either the active regions or the transition regions.

Example embodiment 15: The method of example embodiment 14, wherein identifying areas having non-uniform gratings further comprises: identifying the areas in an active region or transition region having a metal or dielectric material width greater than a first threshold of 0.75-0.85 times a grating pitch of gratings in the areas.

Example embodiment 16: The method of example embodiment 15, further comprising configuring the first threshold to be approximately 0.80 times a grating pitch.

Example embodiment 17: The method of example embodiment 14, 15, or 16, wherein identifying areas having non-uniform gratings further comprises: identifying the areas in an active region or transition region having a grating pitch that is not within a second threshold of approximately +/−10% of the BCP pitch for A-B type copolymers.

Example embodiment 18: The method of example embodiment 14, 15, 16, or 17, further comprising configuring the second threshold to be approximately +/−40% of the BCP pitch for A-B-A type copolymers.

Example embodiment 19: The method of example embodiment 14, 15, 16, 17, or 18, wherein analyzing the one or more layout designs for the active regions and the transition regions further comprises analyzing one or more layout designs based on a plurality of layout design rule constraints. The design rule constraints comprise a first constraint requiring that active regions comprise a first grating of metal and dielectric materials with only vertically aligned structures thereon. The design rule constraints comprise second constraint requiring that transition regions comprise a second grating of metal and dielectric materials having at least one of vertical aligned structures and vertical random structures thereon.

Example embodiment 20: The method of example embodiment 19, wherein after identifying areas having non-uniform gratings further the method further comprises at least one of: the modifying the one or more layout designs for the areas, and selectively grafting either PS or PMMA onto a metal of the non-uniform gratings and grafting a neutral polymer component onto an ILD of the non-uniform gratings.

Example embodiment 21: A method of fabricating an integrated structure (IC) using direct self-assembly (DSA) comprises receiving a substrate with one or more active regions separated by transition regions. Block copolymers are received that are Lamellae-forming. One or more gratings on the substrate, wherein the grating pitch is within 10% of the BCP pitch for A-B type copolymers or 60% of the BCP pitch for A-B-A type copolymers. A block copolymer DSA solution is deposited on the substrate and the gratings. The DSA solution is annealed, and one of the block copolymers is removed. Trenches are etched in the material previously covered by the first copolymer. A metal is deposited in the etched trenches and planarizing to define the structures including traces or interconnects. Further die processing is performed.

Example embodiment 22: The method of example embodiment 21, further comprising: utilizing polystyrene-bpolymethylmethacrylate (PS-b-PMMA) as the block copolymer, the block copolymer comprising a PS component and a PMMA component.

Example embodiment 23: The method of example embodiment 22, wherein the PS component is assembled over conductive layers, and wherein the PMMA component is assembled over insulating layers.

Example embodiment 24: The method of example embodiment 22, wherein the PS component is assembled over the insulating layers, and wherein and the PMMA component is assembled over the conductive layers.

Example embodiment 25: The method of example embodiment 22, wherein one of the PS component and the PMMA component is assembled over conductive layers, and wherein a neutral component is assembled over insulating layers to reduce formation of parallel horizontal block copolymer structures.

What is claimed is:

1. An integrated circuit structure, comprising:
   an active region containing more active semiconductor devices, the active region comprising a first grating of metal and dielectric materials with only vertically aligned structures thereon; and
   a transition region containing inactive structures adjacent to the active region, the transition region comprising a second grating of metal and dielectric materials having at least one of vertical aligned structures and vertical random structures thereon,
   wherein both the active regions and the transition regions have an absence of non-uniform gratings with horizontal parallel polymer sheets.

2. The integrated circuit structure of claim 1, wherein a width of the metal and dielectric materials comprising the first grating of the active region is less than approximately 0.15 to 0.25 times a grating pitch of the first grating.

3. The integrated circuit structure of claim 2, wherein a width of the metal and dielectric materials comprising the first grating of the active region is approximately 0.20 times a grating pitch of the first grating.

4. The integrated circuit structure of claim 1, wherein the active region further comprises: dummy structures in the first grating that make a grating pitch of the first grating within approximately +/−10% of a BCP pitch for A-B type copolymers.

5. The integrated circuit structure of claim 4, wherein the BCP pitch is less than 80 nm.

6. The integrated circuit structure of claim 5, wherein the BCP pitch is 10-50 nm.

7. The integrated circuit structure of claim 1, wherein dummy structures in the first grating make the grating pitch of the first grating within approximately +/−40% of the BCP pitch for A-B-A type copolymers.

8. The integrated circuit structure of claim 1, wherein the transition region further comprises: dummy structures in the second grating that make a grating pitch of the second grating within approximately +/−10% of a BCP pitch for A-B type copolymers.

9. The integrated circuit structure of claim 8, wherein the BCP pitch is less than 80 nm.

10. The integrated circuit structure of claim 8, wherein the BCP pitch is 10-50 nm.

11. The integrated circuit structure of claim 1, wherein a width of the metal and dielectric materials comprising the second grating of the transition region is less than approximately 0.15 to 0.25 times a grating pitch of the second grating.

12. The integrated circuit structure of claim 11, wherein a width of the metal and dielectric materials comprising the second grating of the transition region is approximately 0.20 times a grating pitch of the second grating.

13. The integrated circuit structure of claim 1, wherein dummy structures in the second grating make the grating pitch of the second grating within approximately +/−40% of the BCP pitch for A-B-A type copolymers.

* * * * *